United States Patent [19]

Adams et al.

[11] 4,425,543
[45] Jan. 10, 1984

[54] HIGH STABILITY BUFFERED PHASE COMPARATOR

[75] Inventors: William A. Adams, College Park; Victor S. Reinhardt, Gaithersburg, both of Md.

[73] Assignee: The United States of America as represented by the Administrator of the National Aeronautics and Space Administration, Washington, D.C.

[21] Appl. No.: 284,314

[22] Filed: Jul. 17, 1981

[51] Int. Cl.³ .............................................. G01R 25/00
[52] U.S. Cl. ............................... 324/83 R; 324/79 R; 324/83 A; 328/133; 330/289
[58] Field of Search ................. 324/83 R, 83 A, 79 R; 330/289; 307/310; 328/11, 133, 134

[56] References Cited

U.S. PATENT DOCUMENTS

| | | | |
|---|---|---|---|
| 3,048,782 | 8/1962 | Altman | 328/133 |
| 3,187,195 | 6/1965 | Stefanov | 324/79 R |
| 3,359,504 | 12/1967 | Bento et al. | 330/289 |
| 4,246,497 | 1/1981 | Lawson | 324/83 A |

Primary Examiner—Michael J. Tokar
Attorney, Agent, or Firm—Robert E. Bushnell; John O. Tresansky; John R. Manning

[57] ABSTRACT

A low noise RF signal phase comparator comprised of two high stability driver-buffer amplifiers (16 and 18) driving a double balanced mixer (14) which operate to generate a beat frequency between the two RF input signals coupled to the amplifiers from the RF sources. The beat frequency output from the mixer is applied to a low noise zero crossing detector (20) which generates a square wave output whose positive and negative going edges provide a measure of the phase difference between the two RF inputs. Temperature stability is provided by mounting the amplifiers (16 and 18) and mixer (14) on a common circuit board (29) with the active circuit elements (62, 68, 70, 82, 88, 90, 110) thereof being located on one side of a circuit board (29) while the passive circuit elements (112) are located on the opposite side. A common heat sink (28) consisting of a relatively thick metal plate of relatively large mass and having a plurality of recesses or bores (31, 33, 35, 37, 39, 41) formed therein is located adjacent the circuit board (29) such that the active circuit elements (62, 68, 70, 82, 88, 90, 110) are embedded into the bores which has the effect of slowing down the effect of ambient temperature changes and reduces the temperature gradients between the active circuit elements, and thus improving the cancellation of temperature effects inherent in such devices. Additionally, the two amplifiers (16 and 18) include individual voltage regulators (70 and 90) which effectively increases RF isolation by reducing cross-talk through the power supply connected thereto.

19 Claims, 9 Drawing Figures

HIGH STABILITY BUFFERED PHASE COMPARATOR

ORIGIN OF INVENTION

The invention described herein was made by employees of the United States Government and may be manufactured and used by or for the Government for governmental purposes without the payment of any royalties thereon or therefor.

CROSS REFERENCE TO RELATED APPLICATION

This application is related to an application for an invention entitled, "High Stability Amplifier", (GSC 12,646-1) U.S. Ser. No. 284,290, filed in the names of the present inventors on July 17, 1981. The application is also assigned to the assignee of this invention.

1. Technical Field

The invention relates generally to electrical signal phase comparators and more particularly to a phase comparator for RF signals which exhibits a relatively high degree of RF isolation and stability with respect to ambient temperature changes.

2. Background Art

In applications where it is required to compare the phases of two RF signals that are nearly the same frequency with a higher degree of precision, such as being able to measure the phase difference to within $1 \times 10^{-12}$ seconds (picoseconds) without the signal sources interacting with each other, it is necessary to provide a relatively large amount of signal isolation therebetween. This is achieved by means of buffer amplifiers between the signal sources. While known prior art signal buffers operate to provide a certain degree of isolation, the means by which phase comparison has heretofore been made has been found to be inadequate particularly where temperature stability is concerned. It has been found that unless a relatively high stability with respect to ambient temperature changes is maintained, phase noise results which prevents the measurement of phase difference with a desired degree of resolution.

Accordingly, it is an object of the present invention to provide a low noise phase comparator which is operable at RF frequencies.

Another object of the invention is to provide a low noise phase comparator which exhibits a relatively high degree of output stability with respect to changes in ambient temperature.

Still another object of the invention is to provide a low noise phase comparator which provides a high degree of isolation between relatively high precision frequency sources.

Still a further object of the invention is to provide a phase comparator adapted to meet the variety of precise time and frequency measurement and distribution tasks.

STATEMENT OF INVENTION

These and other objects are provided by means of a high stability buffer phase comparator comprised of a pair of high stability, driver-buffer amplifier circuits coupled to a double balanced mixer located in a common housing along with a common heat sink into which are embedded the active elements of the amplifier and mixer circuits. The output of the balanced mixer is fed to a signal level crossing detector which is located in an adjoining housing and is adapted to generate a square wave whose positive and negative going edges correspond to the phase difference between two RF signals applied to the amplifiers.

The foregoing as well as other objects, features and advantages of the invention will become more apparent from the following detailed description when taken in conjunction with the accompanying drawings.

DETAILED DESCRIPTION OF INVENTION

Figure 1:
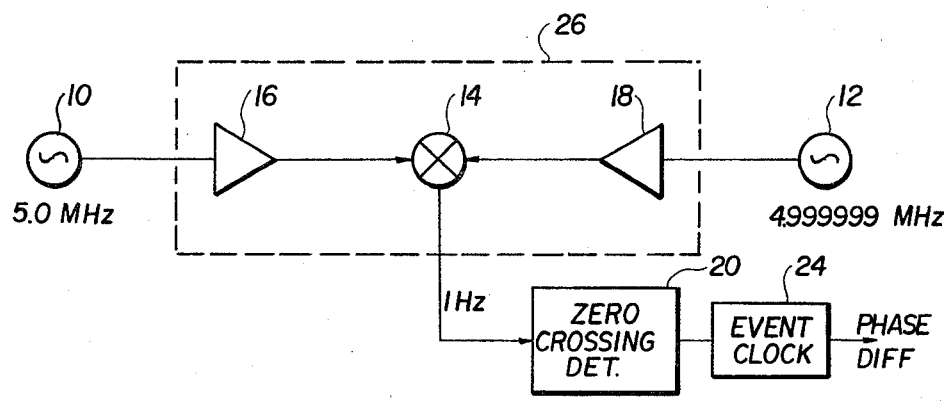
FIG. 1 is an electrical block diagram generally illustrative of the invention.

Referring now to the drawings and more particularly to FIG. 1, disclosed thereat is a system for comparing the phase of two relatively high precision RF signal generators 10 and 12 whose frequencies are substantially the same. While the system is adapted to operate with RF signals covering the range from 30 KHz to 45 MHz, in the preferred embodiment the frequency sources 10 and 12 comprise atomic frequency standards such as a cesium frequency standard or a standard implemented by means of a hydrogen maser where 5 MHz signals are provided thereby. In order to compare their relative frequencies, the sources 10 and 12, which for example provide a 5.0 MHz and 4.999999 MHz frequency output, respectively, are coupled to a double balanced mixer 14 by means of a pair of signal amplifiers 16 and 18 which provide amplification and buffering for the two signals from the sources 10 and 12. The mixer operates in a well known manner to heterodyne the two RF signals and provide a difference signal, comprising for example a one Hertz beat frequency signal, which is applied to a zero crossing detector 20 having a low pass filtered input and providing a very fast, e.g. ~20 nanosecond ($1 \times 10^{-9}$ sec.), rise time output pulse. The zero crossing detector 20 generates a square wave output whose positive and negative going edges correspond to the phase difference between two RF inputs from the sources 10 and 12. An event clock 24, when coupled to the output of the zero crossing detector 20, is adapted to measure the time of the edge crossings of the positive and negative going edges and provide an indication of the phase difference between the 5.0 MHz and 4.999999 MHz inputs.

In order to provide an accurate measure of the phase difference between the extremely stable frequency sources 10 and 12, it is necessary that the circuitry implementing the balanced mixer 14 and the amplifiers 16 and 18, and to a lesser extent the zero crossing detector 20 not degrade the phase stability of the RF signals translated thereby and thus there is a requirement that a relatively high degree of output stability must be exhibited particularly with respect to ambient temperature changes over a relatively long period of time.

Figure 3:
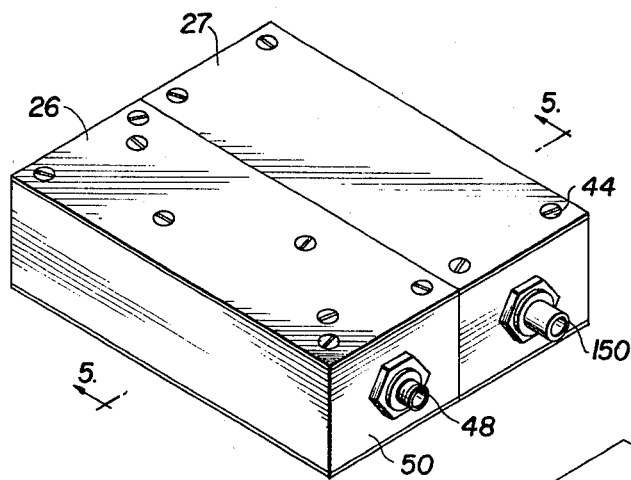
FIG. 3 is a perspective view generally illustrative of the composite housing structure for the circuitry shown in FIGS. 2A and 2B.
Figure 2A:
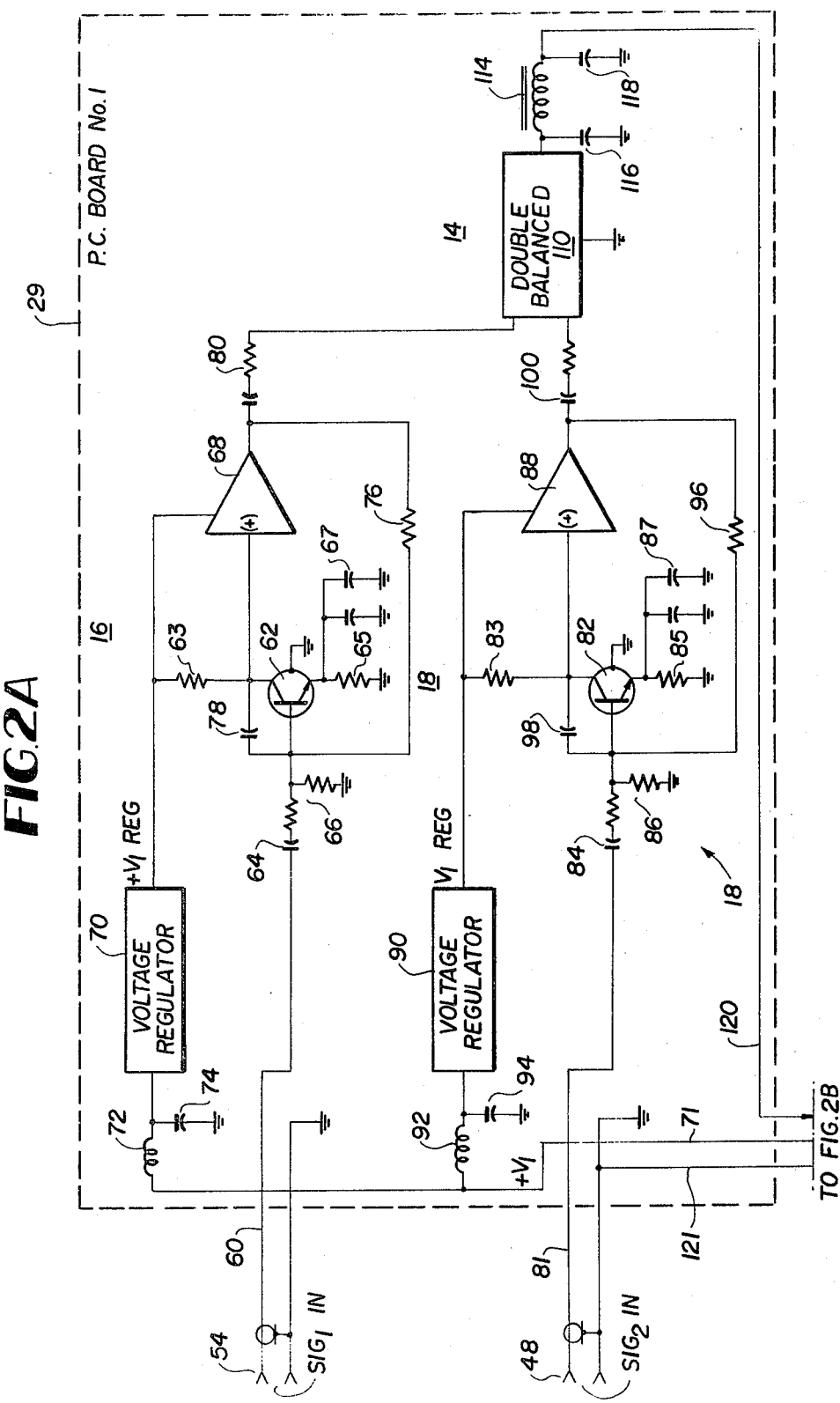
FIGS. 2A and 2B depict a detailed electrical schematic diagram of the preferred embodiment of the invention.

In order to achieve such a performance, the circuitry embodying the balanced mixer 14 and the amplifiers 16 and 18 as shown in FIG. 2A is located in a common metallic housing 26 shown in FIG. 3 and which also includes therein a common heat sink 28 for all of the active circuit elements used to implement the mixer 14 and the amplifiers 16 and 18. The heat sink 28 comprises a relatively large mass and operates to slow down the effect of ambient temperature changes and reduces temperature gradients across the active circuit components, thus improving the cancellation of temperature effects inherent in such devices. The heat sink 28 is shown in detail in FIG. 4 and will be considered in further detail subsequently. In addition to the common housing 26, a second metal housing 27 is also shown in FIG. 3 which is utilized to house the circuitry shown in FIG. 2B which circuitry includes the circuit components for implementing the zero crossing detector 20 shown in FIG. 1. The two housings 26 and 27 are contiguously fastened together by means not shown.

Figure 4:
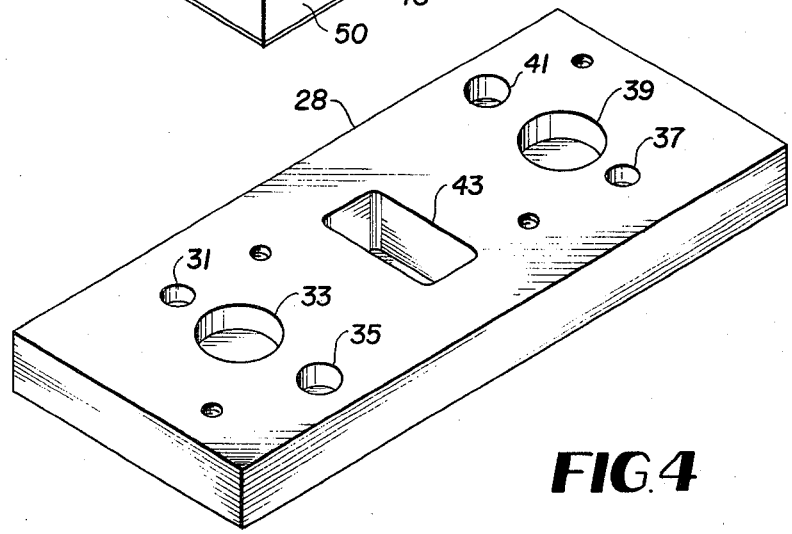
FIG. 4 is a perspective view of the common heat sink for a portion of the circuitry shown in FIG. 2A.
Figure 5:
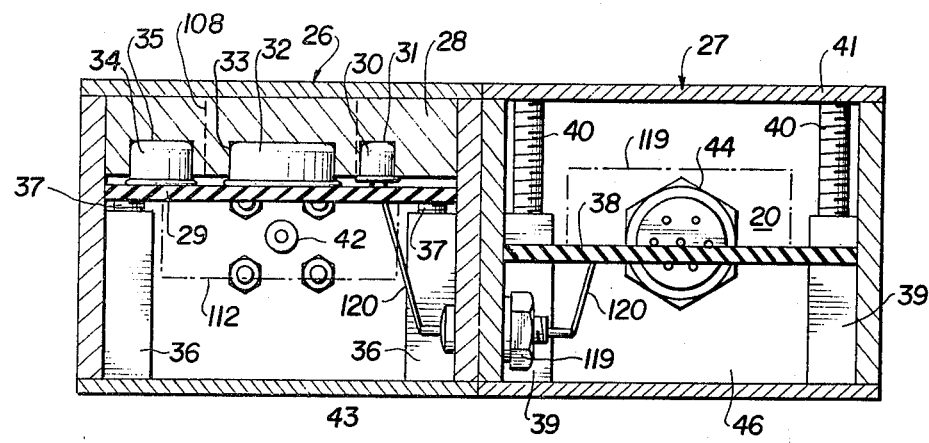
FIG. 5 is a cross sectional view of the housing shown in FIG. 3 taken along the lines 5—5 thereof.

Referring now briefly to FIG. 5, which is a transverse cross section of FIG. 3, the interior of the housing 26, in addition to including the heat sink 28 also includes a circuit board 29 placed in close proximity to the heat sink 28. Three members 30, 32 and 34 of seven are shown mounted on one side of the circuit board 34 projecting into the heat sink 28. These members 30, 32 and 34 constitute the top portion or covers of hermetically sealed packaging means for the active circuit elements (semiconductors) included in the amplifier 16 and fit into the bores 31, 33 and 35 of FIG. 4. In the same fashion the bores 37, 39 and 41 (FIG. 4) receive the packaging means containing the active circuit elements in the amplifier 16 while the bore 43 accepts the active circuit elements in an integrated circuit embodying the double balanced mixer 14. The circuit board 29, moreover, is held in position by opposing spacer members 36 with the circuit board being secured thereto by means of screw type hardware 37. Insofar as the adjoining housing 27 is concerned, it also includes a circuit board 38 centrally located therein. It is held in position by means of spacer elements 29 and flat headed screws 40 passing through the top cover plate. FIG. 5 additionally discloses an input connector 42 located in one end (far) wall 43 of the housing 26. This connector is adapted to receive one of the RF inputs to the amplifiers 16 and 18 shown in FIG. 1. FIG. 5 also shows a connector 44 located in the far end wall 46 of the housing 27 which has for its purpose coupling of power supply potentials to the circuitry included in both housings 26 and 27.

Referring now to the schematic diagram of the electronic circuitry included in the preferred embodiment of the invention, reference will now be made to FIGS. 2A and 2B. Referring first to FIG. 2A which includes the buffer amplifiers 16 and 18 and the mixer 14, a pair of RF signal input terminals in the form of co-axial connectors 42 and 48 are adapted to be coupled to the RF signal sources 10 and 12 (FIG. 1). Connector 48 is located in the opposite end wall 50 of the housing 26 as shown in FIG. 5. Both of the buffer amplifiers 16 and 18 are comprised of three major components, namely a voltage regulator, a driver transistor and an operational amplifier. More specifically with respect to buffer amplifier 16, the RF input signal coupled from the source 10 to connector 42 is applied by way of lead 60 to a single driver transistor 62 through a coupling capacitor 64 and a resistor voltage divider network 66. The driver transistor 62 typically comprises a Motorola type 2N2857N-P-N transistor coupled in a feedback circuit arrangement to the non-inverting input (+) of an operational amplifier 68 which typically comprises a National Semiconductor LH0033 integrated circuit module. Both the transistor 62 and the operational amplifier 68 are adapted to receive a regulated $+V_1$ supply potential provided by a RF signal isolating voltage regulator 70 which receives an unregulated $+V_1$ power supply potential from the connector 44 (FIG. 2B) via lead 71 after being filtered by a combination of inductor 72 and capacitor 74. The voltage regulator 70 typically comprises a Motorola type MC1569G integrated circuit module. What is significant, however, is that the transistor 62, the operational amplifier 68 and the voltage regulator 70 are encapsulated in packages which are mounted on the circuit board 29 and include respective cover members 30, 32 and 34 as shown in FIG. 5 which are embedded in the recesses or bores 31, 33 and 35 of the common heat sink 28.

In operation, the transistor 62 whose collector is connected to a load resistor 63 and whose emitter is connected to ground through the resistor 65 and capacitors 67, acts as a signal gain device. The operational amplifier 68, on the other hand, operates as a unity gain signal isolation device. The gain for the composite feedback amplifier implemented by the combination of the transistor 62 and the operational amplifier 68 is determined by the component values of a feedback resistor 76 coupled from the output of the operational amplifier 68 back to the base of transistor 62 as well as a capacitor 78 coupled from the collector of transistor 62 back to its base.

In a like manner, the RF input signal from the source 12 applied to the input connector 48 is coupled to the base of transistor 82 via the circuit lead 81, the coupling capacitor 84 and the resistor voltage divider network 86. Also coupled to the transistor 82 is a collector load resistor 83 and a grounded emitter resistor 85 which is shunted by capacitor 87. The transistor 82 is coupled to the non-inverting input(+) of the operational amplifier 88 in a feedback amplifier circuit arrangement with both circuit components being powered from a regulated $+V_1$ potential applied from a second RF signal isolating voltage regulator 90 which is coupled to the unregulated supply potential $+V_1$ via the inductor 92 and the capacitor 94 coupled to lead 71. Both voltage regulators 70 and 90 effectively increase RF isolation on each respective channel by reducing cross-talk through the power supply, not shown, providing, inter alia, the power supply potential $+V_1$. The feedback circuit arrangement including transistor 82 and the operational amplifier 88 also includes the feedback resistor 96 and feedback capacitor 98 which again operate to control the gain of the signal output from transistor 82 while the operational amplifier 88 comprises a unity gain device for providing proper signal isolation. The single transistor 82, the operational amplifier 88 and the voltage regulator 90 also are encapsulated in packaging means having cover members, not shown, which are embedded in the recesses 37, 39 and 41 of the common heat sink block 28 shown in FIG. 4; however, these cover members are identical to the members 30, 32 and 34.

In addition to having the active semiconductor components of the amplifiers 16 and 18 embedded in the heat sink 28, the heat sink 28 also includes a centrally located recess or bore 43 as shown in FIG. 4 which is adapted to accommodate the cover portion, not shown, of the integrated circuit module 110 implementing the mixer 14 and which has the outputs of the operational amplifiers 68 and 88 coupled thereto via the resistive-capacitive networks 80 and 100. The recess 43 is generally rectangular in shape due to the fact that the physical configuration of the housing of an MCL type SRA1-1 double balanced mixer which is utilized in the preferred embodiment has such a shape. Accordingly, the shape of the recesses formed in the common heat sink 28 depends upon the physical characteristics of the housings for the active components embedded therein. What is significant about the component mounting on the circuit board 29 in the housing 26 is that the active components as shown in FIG. 5 are mounted on one side of the circuit board 29 while the passive circuit components which are shown by a general designation 112, (FIG. 5) are located on the other side of the circuit board. Such an arrangement provides a means whereby the effect of ambient temperature change on the individual devices is not only slowed down, but temperature gradients therebetween are reduced, which has the added advantage that the temperature effects inherent in matched semiconductor devices are cancelled. This is particularly true for the semiconductor devices utilized in the double balanced mixer 14 which uses four matched diodes, not shown.

The output of the double balanced mixer 14 is filtered by means of the combination of a series inductor 114 and two capacitors 116 and 118. The filter output signal from the mixer 14 is fed by a signal feedthrough conductor 120 to the zero crossing detector 20 located on the circuit board 38 contained in the housing 27 and shown by the phantom line 113 of FIG. 5. This circuitry is shown in FIG. 2B.

Figure 2B:
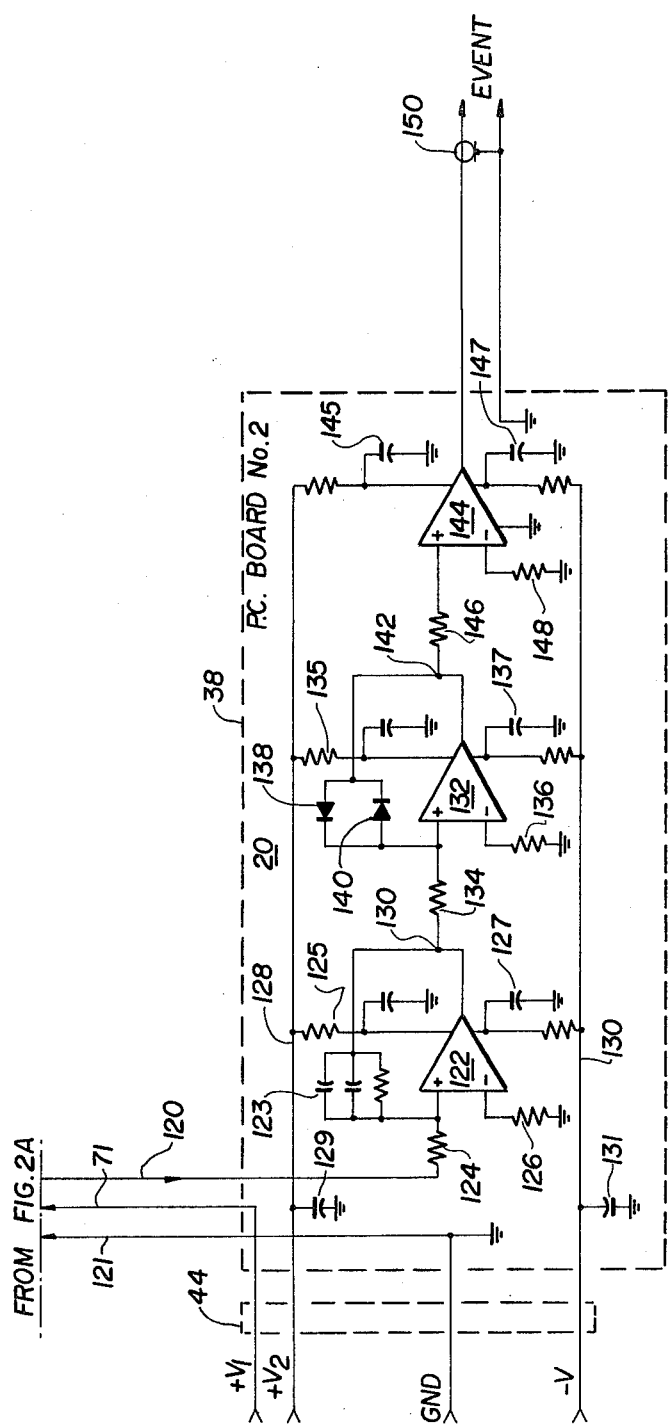

Referring now to FIG. 2B, a first operational amplifier 122 is shown having its non-inverting (+) input terminal coupled to the inductor 114 of FIG. 2A via feedthrough 119 (FIG. 5) by means of resistor 124 while its inverting (−) input terminal is coupled to ground (zero potential) by means of resistor 126. While a common ground exists between the two circuit boards 29 and 38 due to the metal contact between the housings 26 and 27, it is shown schematically by a circuit lead 121. The operational amplifier 122 is powered by means of $+V_2$ power supply potential and $-V$ power supply potential appearing on the circuit busses 128 and 130 having respective filter capacitors 129 and 131 coupled therefrom to ground. The operational amplifier 122 operates as a voltage comparator referenced to ground and is thus able to operate as a zero crossing detector; however, the circuit also includes a capacitive-resistive feedback network 123 which implements a low pass filter circuit to provide a low pass filtered input. In order to provide abrupt leading and trailing edges ($\sim 20$ nanoseconds) of the output from the operational amplifier 122 which occurs at circuit junction 130, a second operational amplifier 132 is coupled to circuit junction 130 by means of resistor 134. Resistor 134 is coupled to the non-inverting (+) input terminal of operational amplifier 132 while its inverting (−) input terminal is connected to ground by means of resistor 136. The operational amplifier 132 thus also acts as a zero crossing detector; however, there is also coupled thereto a feedback network comprised of oppositely poled parallel diodes 138 and 140 which provides a square wave at junction 142. Extremely fast operation is provided even though the input is filtered by the network 123. In order to provide further amplification, a third operational amplifier 144 is utilized having its non-inverting input terminal coupled to the junction 142 by means of resistor 146, the operational amplifier 144 additionally operates as a comparator by means of having its negative input connected to ground by means of the resistor 148. Thus all three operational amplifiers 122, 132 and 144 are configured as comparator amplifiers referenced to ground with the output amplifier 144 being coupled to a terminal 150. The resistive-capacitive networks 125, 127, 135, 137, 145 and 147 are shown coupled to the operational amplifiers to establish the required bias levels for proper operation.

By measuring the time difference between the edge crossings of the zero crossing detector 20 as evidenced by the positive and negative going edges of a square wave output which appears at the output connector 150, the phase difference between the RF inputs from sources 10 and 12 can be determined when applied to the event clock 24 shown in FIG. 1. With the circuitry shown in FIG. 2A having its active circuit components embedded in the heat sink 28 which comprises a relatively large mass in comparison to the mass of the active elements and the circuitry as shown in FIG. 2B which implements a zero crossing detector, high stability is achieved despite changing ambient temperature. A high electrical isolation exists between the input RF signals due to the fact that individual voltage regulators 70 and 90 provided on each channel act to reduce cross-talk through the power supply. Enhancement of operation also results due to the double balancing of the mixer 14 and the use of four matched diodes in the mixer 14.

Figure 6:
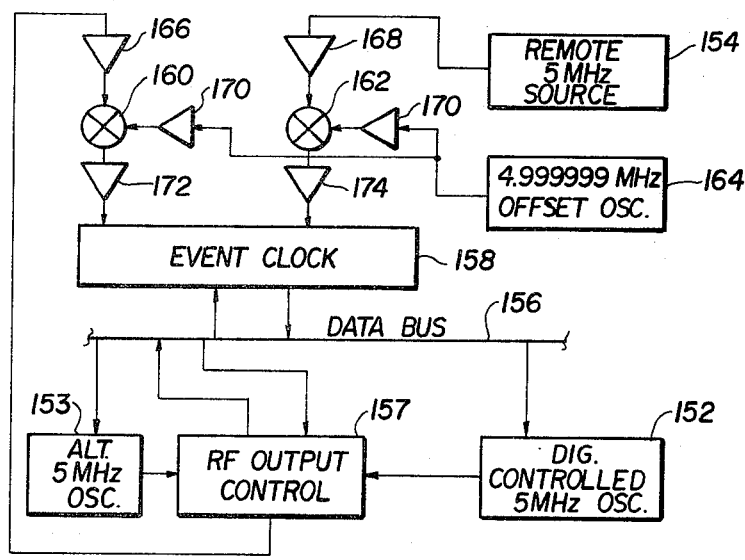
FIG. 6 is an electrical block diagram of a typical application of the subject invention.

One typical application for the subject invention is illustrated in FIG. 6 and involves a phase comparison system employing a dual mixer technique where it is desired to monitor the phase between two extremely stable frequency sources 152 and 154 and to alter the phase of, for example, source 152 to bring it into synchronism with source 154. The source 152 comprises a controlled oscillator which can be digitally controlled from a signal applied from a digital data buss 156 in accordance with the output of a multi-channel event clock 158 coupled to a pair of mixers 160 and 162 which have a common offset frequency applied thereto from an offset oscillator 164 which has a frequency of, for example, 4.999999 MHz while the frequency of the sources 152 and 154 is 5.0 MHz. Components 166, 168, and 170 comprise amplifier circuits corresponding to the amplifiers 16 and 18 shown in FIG. 2A while amplifiers 172 and 174 are separate amplifier configurations shown, for example, in the cross referenced application Ser. No. 284,290 (GSC 12,646-1)

Figure 7:
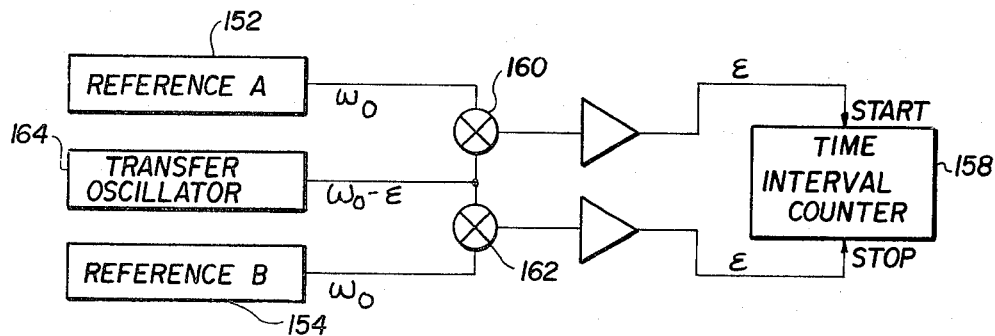
FIG. 7 is an electrical block diagram helpful in understanding the configuration shown in FIG. 6.

Referring now to FIG. 7, in the double mixer technique, the offset oscillator 164 acts as a transfer oscillator of nominal angular frequency $\omega_O-\epsilon$ which is used to heterodyne the output frequency $\omega_O$ from two reference sources A and B which consist of the oscillators 152 and 154. As shown, a time interval counter 158 will measure the time difference between the zero crossings of two beats from the mixers 160 and 162 wherein one beat is operable to provide a start control for the event clock 158 of FIG. 7 while the other is adapted to provide a stop signal for the clock. This time difference corresponds to the phase difference between the 5.0 MHz sources 152 and 154. This measurement in digital form outputted from the event clock 158 of the data buss 156 is adapted to track and bring the controlled oscillator 152 into phase with the source 154. As shown in FIG. 7, the system also includes an RF output control circuit 157 which comprises an RF switch which is adapted to couple a second 5.0 MHz signal from a controlled oscillator 153 to the mixer 160 in the event that another source is to be utilized for comparison or the controlled oscillator 152 for some reason or another becomes inoperative.

Figure 8:
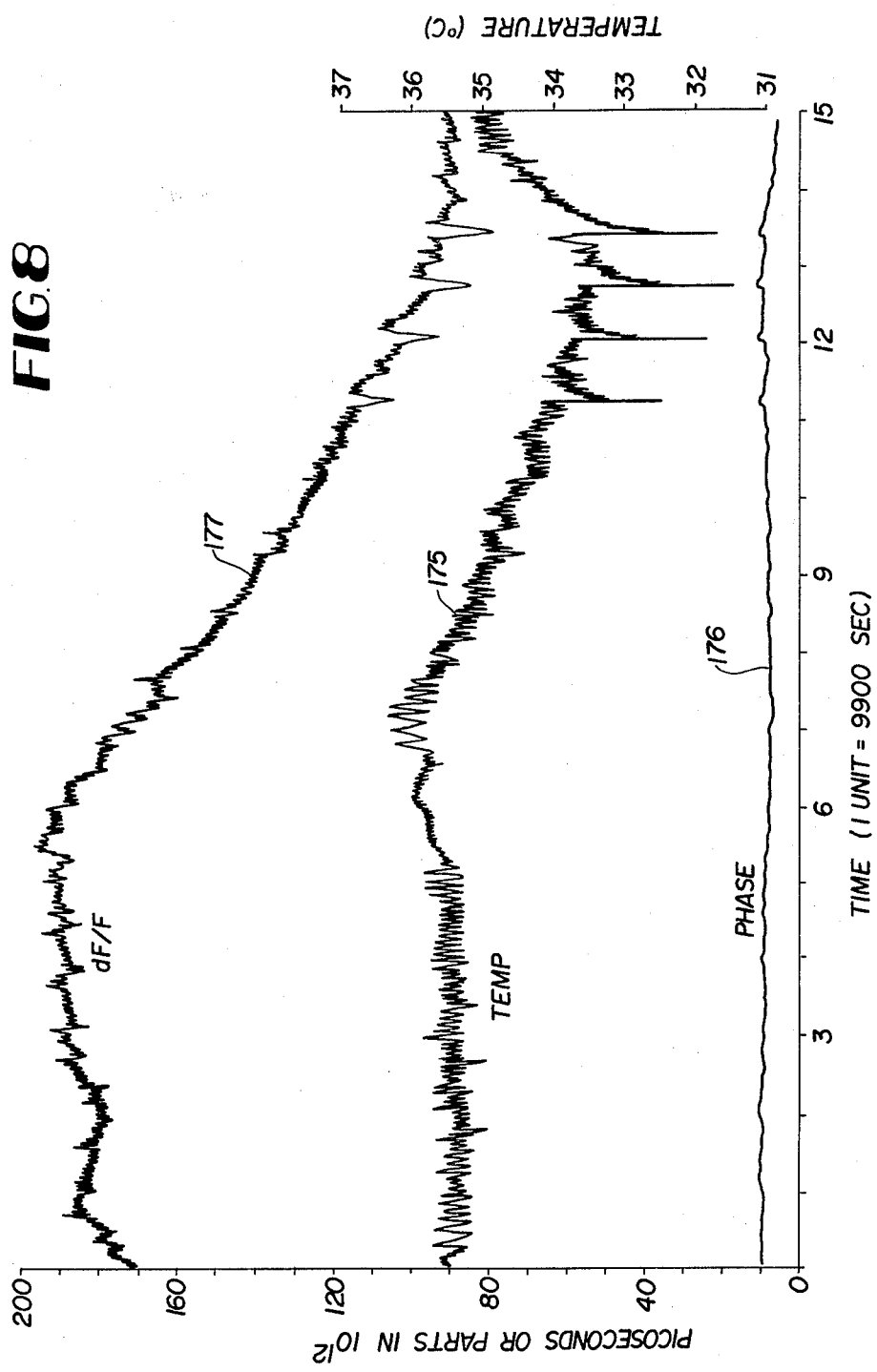
FIG. 8 is a graph illustrative of the stability characteristic for the application shown in FIG. 6.

A typical longterm stability characteristic achieved by the subject invention is shown in FIG. 8 as it pertains to the phase comparison system shown in FIG. 6. Referring now to FIG. 8 where, for example, ambient temperature as evidenced by graphical curve 175 varies over a 5° C. temperature range for a period of time (15×9900 sec.) which corresponds to several days, the phase stability of the comparison between the two sources 152 and 154 which is measured at the event clock 158 is shown by graphical curve 176. Phase stability on the order of one picosecond ($1 \times 10^{-12}$ sec.) is shown to result notwithstanding a frequency variation of the transfer oscillator 164 as evidenced by the graphical curve 177 which varies in accordance with the ambient temperature.

Thus the system as shown in FIG. 6 is adapted, for example, to intercompare a plurality of hydrogen masers, not shown, with sub-picosecond resolution. Such a system is also adapted to provide a means of tracking the average phase of multiple cesium frequency standards. Also in a remote distribution of measurement system, such an arrangement can be used to monitor an RF signal sent from a main site down a cable and return the same RF signal to the main site via a parallel cable and by monitoring the changes in phase in the parallel cable, the main site can determine a correction to bring a remote RF signal source of essentially the same frequency in phase with the RF frequency at the main site.

Having thus shown and described what is at present considered to be the preferred embodiments of the invention, it should be noted that the detailed specification set forth above has been made by way of explanation only and not limitation and accordingly all modifications, alterations and changes coming within the spirit and scope of the invention are herein meant to be included.

We claim:

1. A low noise RF signal phase comparator for signals of substantially the same frequency and providing a high degree of RF isolation and relatively high phase stability for changes in ambient temperature, comprising:
   first and second buffer amplifier means (16, 18) adapted to be coupled to respective input signals of substantially the same frequency;
   signal mixer means (14) coupled to said first and second means (16, 18) and being operable to heterodyne said input signals to provide a difference signal output;
   said first and second amplifier means and said mixer means each including both active and passive circuit elements;
   common heat sink means (28) in thermal contact with said active circuit elements (62, 68, 70 and 82, 88 90 and 110) of said first and second amplifier means (16, 18) and said mixer means (14) for providing a common temperature reference for said active circuit elements; and
   detector means (20) coupled to said mixer means including a signal level crossover detector (122, 132) for providing an output signal of varying amplitude exhibiting relatively abrupt leading and trailing edges at crossings of a predetermined signal level whereby crossings of said predetermined signal level provide an indication of the phase difference between said input signals.

2. The phase comparator as defined by claim 1 wherein said signal level crossover detector comprises:
   third amplifier means receptively coupled to said mixer means and a reference node maintained at said predetermined signal level for providing a first intermediate signal indicative of differences in amplitude between said difference signal output and said predetermined signal level; and
   fourth amplifier means receptively coupled to said third amplifier means and said reference node for generating a square wave indicative of differences in amplitude between said intermediate signal and said predetermined signal level.

3. The phase detector as defined in claim 2 wherein:
   said third amplifier means includes a first active element having a first output port, a first input port coupled to said mixer means via a first node and another input port maintained at said signal level, and a filter stage coupled between said first node and said first output port; and
   said fourth amplifier means includes a second active element having a second output port, a second input port coupled to said first output port and another input port coupled to said reference node, and a feedback stage formed by oppositely poled diodes coupled between said second input port and said second output port.

4. The phase comparator as defined by claim 1 wherein said common heat sink means (28) comprises a thermally conductive element and having a plurality of recesses (31, 33, 35, 37, 39, 41, 43) formed therein and wherein said active circuit elements (62, 68, 70, 82, 88, 90, 110) are embedded in said plurality of recesses.

5. The phase comparator as defined by claim 1 wherein said active circuit elements (62, 68, 70, 82, 88, 90, 110) include package means (30, 32, 34) which are embedded in said plurality of recesses (31, 33, 35, 37, 39, 41, 43).

6. The phase comparator as defined by claim 1 wherein said first and second amplifier means (16, 18) includes a respective circuit mounting board element (29) and wherein said active circuit elements (62, 68, 70, 82, 88, 90, 110) are mounted one side thereof and said passive circuit elements (112) are mounted on the other side thereof.

7. The phase comparator as defined by claim 1 wherein said heat sink means comprises a relatively thick block (28) of heat conductive material and having a mass which is relatively large in comparison to said active circuit elements (62, 68, 70, 82, 88, 90, 110) of said first and second amplifier means (16, 18) and said mixer means (14).

8. The phase comparator as defined by claim 1 and additionally including first housing means (26) having located therein said first and second amplifier means (16, 18) said signal mixer means (14) and said common heat sink means (28); and
   second housing means (27) having located therein said detector means (20), said first housing means including means (42, 48) for coupling input signals to said first and second amplifier means (16, 18), signal feedthrough means (120) coupling said mixer means (14) to said detector means (20), and means (150) on said second housing (27) for coupling output signals from said detector means.

9. The phase comparator as defined by claim 1 wherein said first and second amplifier means (16, 18) are each comprised of respective voltage regulator means (70, 90) for regulating a power supply potential (+V₁) applied thereto and providing RF isolation from cross-talk through the source providing said power supply potential and a pair of interconnected amplifier circuits (62, 68 and 82, 88) interconnected in feedback circuit relationship, and being powered by a regulated power supply potential (+V REG) applied thereto from said voltage regulator means.

10. The phase comparator as defined by claim 9 wherein one of said pair of amplifier circuits comprises a signal gain producing circuit (62, 82) said second amplifier circuit (68, 88) of said pair comprises a signal isolation circuit, and wherein said mixer means (14) comprises a double balanced mixer including matched diode means.

11. The phase comparator as defined by claim 10 wherein said gain producing circuit (62, 82) includes a transistor wherein said isolation circuit (68, 88) comprises a unity gain isolation circuit.

12. The phase comparator as defined by claim 11 wherein said unity gain isolation circuit (68, 88) includes an operational amplifier.

13. The phase comparator as defined by claim 12 wherein the interconnection of said pair of amplifier circuits in feedback circuit relationship includes a resistor (76, 96) coupled from the output of said isolation circuit (68, 88) to the input of said gain producing circuit (62, 82) and a capacitor (78, 98) coupled from the output of said gain producing circuit (62, 82) to the input of said gain producing circuit, and wherein said resistor (76, 96) and capacitor (78, 79) act in combination to determine the signal gain of said gain producing circuit.

14. The phase comparator as defined by claim 1 wherein said signal level crossover detector comprises at least one comparator circuit (122) having first (+) and second (−) inputs and wherein one (−) of said inputs is coupled to ground reference potential and wherein the other (+) input is connected to said signal mixer means (14), said comparator circuit being operable to compare the amplitude of said difference signal output from said signal mixer means against ground potential and providing an output signal having positive and negative going edges at the ground potential crossover point.

15. The phase comparator as defined by claim 14 wherein said at least one phase comparator (122) comprises an operational amplifier having a capacitive-resistive feedback network (22) coupled thereto, said feedback network thereby implementing a lowpass filter coupled to said operational amplifier (122).

16. The phase comparator as defined by claim 14 and additionally including another comparator circuit (132) having a pair of inputs (+, −) wherein one of said pair of inputs (+) is coupled to the output of said at least one comparator circuit (122) and the other input (−) is coupled to ground potential and additionally including circuit means (138) coupled thereto for providing relatively abrupt leading and trailing edges of said output signal.

17. The phase comparator as defined by claim 16 wherein said another phase comparator (132) comprises an operational amplifier and wherein said circuit means (138) for providing relatively abrupt leading and trailing edges comprises a diode network coupled to said operational amplifier.

18. The phase comparator as defined by claim 17 wherein said diode network (138) comprises a pair of diodes connected in parallel in mutually opposite polarity relation.

19. The phase comparator as defined by claim 16 and additionally including another phase comparator (144) having a pair of inputs (+, −) wherein one of said inputs (+) is coupled to the output of said another phase comparator (132) and the other input (−) is coupled to ground potential and providing an output signal having a predetermined signal amplitude and relatively abrupt leading and trailing edges.

* * * * *